United States Patent
Tsuji et al.

(12) 
(10) Patent No.: US 6,822,164 B2
(45) Date of Patent: Nov. 23, 2004

(54) SEMICONDUCTOR DEVICE AND ELECTRO-OPTICAL DEVICE INCLUDING THE SAME

(75) Inventors: Masuo Tsuji, Chino (JP); Masaaki Abe, Chino (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 10/347,222

(22) Filed: Jan. 21, 2003

(65) Prior Publication Data

US 2003/0151055 A1 Aug. 14, 2003

(30) Foreign Application Priority Data

Jan. 25, 2002 (JP) ......................................... 2002-017651
Jan. 16, 2003 (JP) ......................................... 2003-008067

(51) Int. Cl.[7] .......................... H01L 23/495; H01L 23/48
(52) U.S. Cl. ....................... 174/52.1; 257/666; 257/674; 257/668; 257/672; 257/676; 257/778; 257/690; 257/692; 257/694
(58) Field of Search ........................ 174/52.1; 257/666, 257/668, 672, 673, 674, 676, 778, 690, 692, 694; 349/139, 143, 149, 151, 152, 129

(56) References Cited

U.S. PATENT DOCUMENTS 6,603,071 B2 * 8/2003 Takao ........................ 174/52.1

FOREIGN PATENT DOCUMENTS

| JP | 4-287022 | * 10/1992 |
|---|---|---|
| JP | A 5-63022 | 3/1993 |
| JP | 07-235564 | 9/1995 |
| JP | A 9-24635 | 1/1997 |
| JP | A 9-68715 | 3/1997 |
| JP | A 11-031698 | 2/1999 |
| JP | A 11-145199 | 5/1999 |
| JP | 2000-260798 | 9/2000 |
| JP | 2002-124537 | 4/2002 |

* cited by examiner

*Primary Examiner*—Allan R. Wilson
*Assistant Examiner*—Joseph Nguyen
(74) *Attorney, Agent, or Firm*—Oliff & Berridge, PLC

(57) ABSTRACT

A semiconductor device for supplying a signal to an electro-optical device which displays a two-dimensional image, includes first terminals which are formed along a first side of the semiconductor device in a longitudinal direction and have a length L1 in a direction intersecting the longitudinal direction at right angles; and second terminals which are formed along a second side intersecting the first side at right angles and have a length L2 which is greater than the length L1 in the longitudinal direction.

18 Claims, 12 Drawing Sheets

SEMICONDUCTOR DEVICE AND ELECTRO-OPTICAL DEVICE INCLUDING THE SAME

Japanese Patent Applications No. 2002-17651 filed on Jan. 25, 2002 and No. 2003-8067 filed on Jan. 16, 2003, are hereby incorporated by reference in their entirety.

BACKGROUND OF THE INVENTION

The present invention relates to a semiconductor device which drives a display device such as a liquid crystal display device, and an electro-optical device using the semiconductor device.

An example of a conventional driver IC which drives a liquid crystal display device is described below with reference to FIG. 7. FIG. 7 shows a liquid crystal display device using a conventional driver IC. As shown in FIG. 7, a liquid crystal display device 60 includes a driver IC 20, an upper panel 30, and a substrate 40. A liquid crystal material is sealed between the substrate 40 and the upper panel 30.

The liquid crystal display device 60 has a plurality of segment regions S1, S2, . . . in a segment direction, and a plurality of common regions C1, C2, . . . in a common direction. One pixel (dot) is specified by specifying one segment region and one common region. The liquid crystal display device has 132 segment regions and 64 common regions, for example. In this case, the liquid crystal display device has 132×64 pixels. The driver IC 20 is generally mounted on the substrate 40 so that the side of the driver IC 20 on which terminals are formed (active side) faces the substrate 40. The terminals are connected with interconnects of the substrate 40.

The driver IC 20 supplies segment signals to a plurality of the segment regions. The driver IC 20 supplies common signals to a plurality of the common regions. The driver IC 20 has a shape which is long in one direction. Segment signal output terminals QS1 to QS132 for outputting the segment signals are formed along one side in the longitudinal direction of the mounting side of the driver IC 20 (upper long side in FIG. 7). Common signal output terminals QC1 to QC32 and QC33 to QC64 for outputting the common signals are formed along two sides which intersect the longitudinal direction of the mounting side of the driver IC 20 at right angles (left and right short sides in FIG. 7). Input/output terminals QT1 to QTn are formed along the other side in the longitudinal direction of the mounting side of the driver IC 20 (lower long side in FIG. 7).

Transparent segment interconnects LS1 to LS132 and common interconnects LC1 to LC64 are formed on the substrate 40. One end of each of the segment interconnects LS1 to LS132 is connected with one of the segment regions S1 to S132 of the liquid crystal display device. The other end of each of the segment interconnects LS1 to LS132 makes up an electrode for connecting the segment signal output terminals QS1 to QS132 of the driver IC 20. Similarly, one end of each of the common interconnects LC1 to LC64 on the substrate 40 is connected with one of the common regions C1 to C64 of the liquid crystal display device. The other end of each of the common interconnects LC1 to LC64 makes up an electrode for connecting the common signal output terminals QC1 to QC64 of the driver IC 20. The common electrodes on the upper panel 30 are electrically connected with the common interconnects LC1 to LC64 on the substrate 40 through a conductive bead, silver paste, or the like (not shown in FIG. 7). In other words, the common electrodes on the upper panel 30 are electrically connected with the common output terminals of the driver IC 20 through the common interconnects on the substrate 40.

In the above-described conventional driver IC, the pitch and size of the segment signal output terminals and the common signal output terminals are the same. However, when mounting such a driver IC on the substrate, the common signal output terminals formed on both ends of the longitudinal direction of the driver IC are significantly affected by an assumed error of the installation angle of the driver IC in addition to an assumed alignment error in the longitudinal direction and an assumed alignment error in the direction of the short side, whereby alignment allowance is reduced.

Reduction of alignment allowance results in a decrease in a substantial junction area between the terminal and the interconnect of the substrate when misalignment occurs, whereby problems relating to mounting reliability such as deterioration of electrical characteristics due to an increase in electrical resistance in the junction region and a decrease in strength of the connection area between the terminal and the interconnect of the substrate tend to occur.

Japanese Patent Application Laid-open No. 5-63022 and Japanese Patent Application Laid-open No. 9-24635 disclose ICs for driving a head in which output terminals for a head drive signal are disposed near the upper side of a driver IC, input terminals for a clock signal, data signal, and latch signal are disposed near the left side, output terminals for the clock signal, data signal, and latch signal are disposed near the right side, and input terminals for remaining signals are disposed near of the lower side. The pitch of the input terminals near the left side of the driver IC and the pitch of the output terminals near the right side of the driver IC are greater than the pitch of the output terminals near the upper side. However, if the pitch of the terminals near the left side and the right side is increased, the area of the substrate of the driver IC is increased, whereby a high degree of integration cannot be achieved.

Japanese Patent Application Laid-open No. 9-68715 discloses a liquid crystal display device in which dummy bumps which do not take part in electrical connection are provided in order to reduce occurrence of inclination or misalignment caused by nonuniformity of arrangement density of the bumps when mounting the driver IC.

BRIEF SUMMARY OF THE INVENTION

The present invention may provide a semiconductor device having terminals which can be connected with high reliability, and an electro-optical device including the same.

One aspect of the present invention relates to a semiconductor device for supplying a signal to an electro-optical device which displays a two-dimensional image, the semiconductor device including:

first terminals which are formed along a first side of the semiconductor device in a longitudinal direction and have a length L1 in a direction intersecting the longitudinal direction at right angles; and second terminals which are formed along a second side intersecting the first side at right angles and have a length L2 which is greater than the length L1 in the longitudinal direction.

Another aspect of the present invention relates to an electro-optical device having an electro-optical material layer, the electro-optical device comprising:

the semiconductor device as defined in any one of claims 1 to 10 provided over a substrate, wherein the first terminals include output terminals for supplying a signal to first electrodes, and wherein the second terminals include output terminals for supplying a signal to second electrodes which intersect the first electrodes.

DETAILED DESCRIPTION OF THE EMBODIMENT

Figure 1:
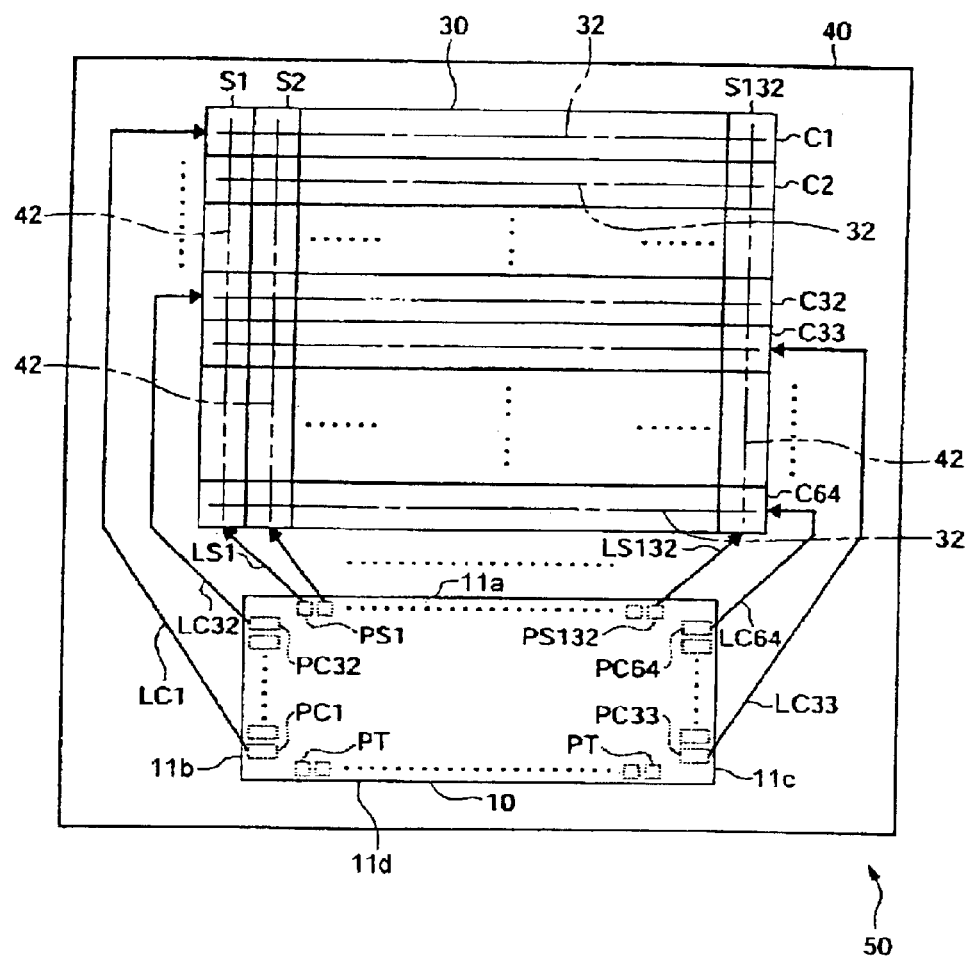
FIG. 1 shows a liquid crystal display device using a semiconductor device according to an embodiment of the present invention.

A semiconductor device for supplying a signal to an electro-optical device which displays a two-dimensional image according to the present invention includes:

first terminals which are formed along a first side of the semiconductor device in a longitudinal direction and have a length L1 in a direction intersecting the longitudinal direction at right angles; and second terminals which are formed along a second side intersecting the first side at right angles and have a length L2 which is greater than the length L1 in the longitudinal direction.

According to the semiconductor device of the present invention, when mounting a semiconductor device in which terminals are disposed at a narrow pitch in the lengthwise direction and the widthwise direction on a substrate, alignment allowance of the terminals formed along the short side of the semiconductor device is improved, whereby a substantial junction area between the terminals and interconnects of the substrate can be sufficiently secured. As a result, occurrence of problems relating to mounting reliability such as deterioration of electrical characteristics due to an increase in electrical resistance in the junction region between the terminals and the interconnects and an insufficiency in strength of the connection area between the terminals and the interconnects of the substrate can be prevented.

The semiconductor device according to the present invention may have at least one of the following features.

(A) A width of each of the first terminals may be equal to a width of each of the second terminals. A pitch of the first terminals may be equal to a pitch of the second terminals.

(B) The first terminals and the second terminals may be formed by bumps.

(C) The semiconductor device may further include third terminals which are formed along a third side intersecting the first side at right angles and have a length L3 which is greater than the length L1 in the longitudinal direction. The length L3 of the third terminals may be equal to the length L2 of the second terminals.

(D) The first terminals may include output terminals for supplying a signal to first electrodes of the electro-optical device, and the second terminals may include output terminals for supplying a signal to second electrodes which intersect the first electrodes. The first terminals and the second terminals may be directly connected with the first electrodes and the second electrodes, respectively. The first terminals and the second terminals may be respectively connected with the first electrodes and the second electrodes through a circuit formed on a substrate (signal voltage conversion circuit or various control circuits, for example).

(E) When a length of the semiconductor device in the longitudinal direction is $X_1$, a width of each of the first terminals is $W_X$, and a width of each of the second terminals is $W_Y$, a width of each of electrodes on a substrate on which the semiconductor device is mounted and which is disposed in the longitudinal direction of the semiconductor device is $W_{LX}$, a width of each of electrodes on the substrate disposed in the direction intersecting the longitudinal direction of the semiconductor device at right angles is $W_{LY}$, $W_{LX}=W_X$, and $W_{LY}=W_Y$, the semiconductor device may satisfy the following equation (1):

$$L2/L1 \geq (W_X - \Delta X1)/\{W_Y - \Delta Y_1 - (X_1/2)\sin \Delta\theta\} \quad (1)$$

$\Delta X_1$ may be an assumed alignment error of the semiconductor device in the longitudinal direction when mounting the semiconductor device on the substrate, and $\Delta X_1 = \Delta Y_1$ (where $\Delta Y_1$ may be an assumed alignment error of the semiconductor device in the direction intersecting the longitudinal direction at right angles when mounting the semiconductor device on the substrate) may be satisfied, and $\Delta\theta$ may be an assumed angular alignment error of the semiconductor device when mounting the semiconductor device on the substrate.

It is assumed that $\Delta X_1$, $\Delta Y_1$, and $\Delta\theta$ are alignment errors when mounting the semiconductor device on the substrate, and are roughly determined depending on accuracy of a device for mounting the semiconductor device on the substrate. Therefore, these values differ depending on accuracy of the mounting device and the like. These values may be within the following ranges. For example, $\Delta X_1$ may be 4 to 8 µm, and $\Delta\theta$ may be 0.015° to 0.025°. Further, $\Delta Y_1$ tends to be the same as $\Delta X_1$. The ratio of the length L1 to the length L2 (L2/L1) may be 1.02 to 3.44 taking into consideration the ranges of $\Delta X_1$, $\Delta Y_1$, and $\Delta\theta$.

An electro-optical device having an electro-optical material layer according to the present invention includes:

the above semiconductor device according to the present invention provided on a substrate, wherein the first terminals include output terminals for supplying a signal to first electrodes, and wherein the second terminals include output terminals for supplying a signal to second electrodes which intersect the first electrodes.

The electro-optical device according to the present invention may have any of the following features.

(a) The substrate may be the same as a substrate on which the electro-optical material layer is formed (substrate which forms a display section of the electro-optical device). For example, in a liquid crystal display device in which a liquid crystal material (electro-optical material) is sealed between two substrates (upper panel and lower panel) which face each other, the substrate may be one of the two substrates which face each other. In the case where the substrate is the substrate on which the electro-optical material layer is formed, a Chip on Glass (COG) Method may be employed, for example. The substrate may differ from a substrate on which the electro-optical material layer is formed (substrate which does not form a display section of the electro-optical device). In this case, the substrate may be a flexible substrate in which a Tape Automated Bonding (TAB) Method or a Chip on Film (COF) Method is employed.

(b) When a length of the semiconductor device in the longitudinal direction is $X_1$, a width of each of the first terminals is $W_X$, a width of each of the second terminals is $W_Y$, a width of each of electrodes on the substrate disposed in the longitudinal direction of the semiconductor device is $W_{LX}$, and a width of each of electrodes on the substrate disposed in the direction intersecting the longitudinal direction of the semiconductor device at right angles is $W_{LY}$, the electro-optical device may satisfy the following equation (2):

$$L2/L1 \geq \{(W_X + W_{LX})/2 - \Delta X_1\}/\{(W_Y + W_{LY})/2 - \Delta Y_1 - (X_1/2)\sin\Delta\theta\} \quad (2)$$

$\Delta X_1$ may be an assumed alignment error of the semiconductor device in the longitudinal direction when mounting the semiconductor device on the substrate, $\Delta Y_1$ may be an assumed alignment error of the semiconductor device in the direction intersecting the longitudinal direction at right angles when mounting the semiconductor device on the substrate, and $\Delta\theta$ may be an assumed angular alignment error of the semiconductor device when mounting the semiconductor device on the substrate.

In the equation (2), $\Delta X_1$ may be 4 to 8 μm, $\Delta Y_1$ may be 4 to 8 μm, and $\Delta\theta$ may be 0.015° to 0.025° in the same manner as in the equation (1). The ratio of the length L1 to the length L2 (L2/L1) may be 1.02 to 3.44 taking into consideration the assumed alignment errors and the width of the electrodes.

(c) The first electrodes may be ones of data lines (also called "segment electrodes" in the following embodiment) and scanning lines (also called "common electrodes" in the following embodiment), and the second electrodes may be the other of the data lines and the scanning lines.

(d) The electro-optical material may be a liquid crystal material, and the liquid crystal material layer may be sealed between two substrates which face each other to form a liquid crystal display device.

Embodiments of the present invention are described below with reference to the drawings.

FIG. 1 shows a liquid crystal display device using a semiconductor device according to an embodiment of the present invention. The liquid crystal display device in the present embodiment is driven by using a passive matrix method, for example. As shown in FIG. 1, a liquid crystal display device 50 includes a driver IC 10, an upper panel 30, and a substrate (lower panel) 40 formed of glass, plastic, or the like. A liquid crystal material (not shown) is sealed between the substrate 40 and the upper panel 30.

Figure 8:
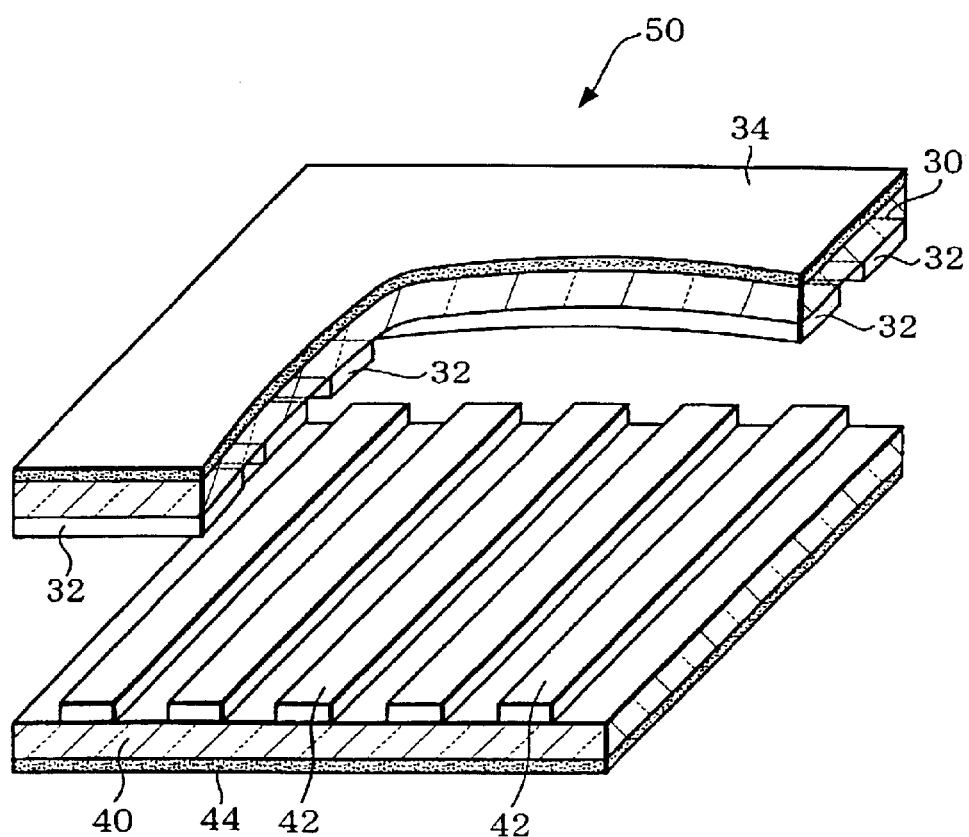
FIG. 8 is a perspective view showing a liquid crystal display device using a semiconductor device according to an embodiment of the present invention.

FIG. 8 is an enlarged partial perspective view showing a display section of the liquid crystal display device 50 shown in FIG. 1. As shown in FIG. 8, in the present embodiment, a plurality of segment electrodes 42 formed on the substrate 40 and a plurality of common electrodes 32 formed on the upper panel 30 are disposed to intersect each other at right angles. In FIG. 8, symbols 34 and 44 indicate polarizers formed on the upper panel 30 and the substrate 40, respectively.

As shown in FIG. 1, the liquid crystal display device 50 has a plurality of segment regions S1, S2, . . . in a segment direction, and a plurality of common regions C1, C2, . . . in a common direction. One pixel (dot) is specified by specifying one segment region and one common region. The liquid crystal display device has 132 segment regions and 64 common regions, for example. In this case, the liquid crystal display device has 132×64 pixels. The driver IC 10 is mounted on the substrate 40 by means of COG mounting so that the side of the driver IC 10 on which terminals are formed (active side) faces the substrate 40. The terminals are connected with interconnects of the substrate 40.

Transparent segment interconnects LS1 to LS132 and common interconnects LC1 to LC64 are formed on the substrate 40. One ends of the segment interconnects LS1 to LS132 are respectively connected with segment electrodes 42 in the segment regions S1 to S132. The other ends of the segment interconnects LS1 to LS132 make up electrodes for connecting segment signal output terminals (first terminals) PS1 to PS132 of the driver IC 10. Similarly, one ends of common interconnects LC1 to LC64 on the substrate 40 are respectively connected with common electrodes 32 in the common regions C1 to C64 of the liquid crystal display device on the upper panel 30. The other ends of the common interconnects LC1 to LC64 make up electrodes for connecting common signal output terminals (second terminals) PC1 to PC64 of the driver IC 10. The common electrodes 32 on the upper panel 30 are electrically connected with the common interconnects LC1 to LC64 on the substrate 40 through a conductive bead, silver paste, or the like (not shown). In other words, the common electrodes 32 on the upper panel 30 are electrically connected with the common output terminals PC1 to PC64 of the driver IC 10 through the common interconnects LC1 to LC64 on the substrate 40.

It is preferable that electrolytic corrosion do not occur in the common electrodes 32 and the segment electrodes 42. The common electrodes 32 and the segment electrodes 42 are formed of an ITO (indium tin oxide) film, for example. The driver IC 10 is thermally bonded to the electrodes formed by the ends of the common interconnects LC1 to LC64 and the segment interconnects LS1 to LS132 formed on the substrate 40 through an anisotropic conductive film.

Figure 2:
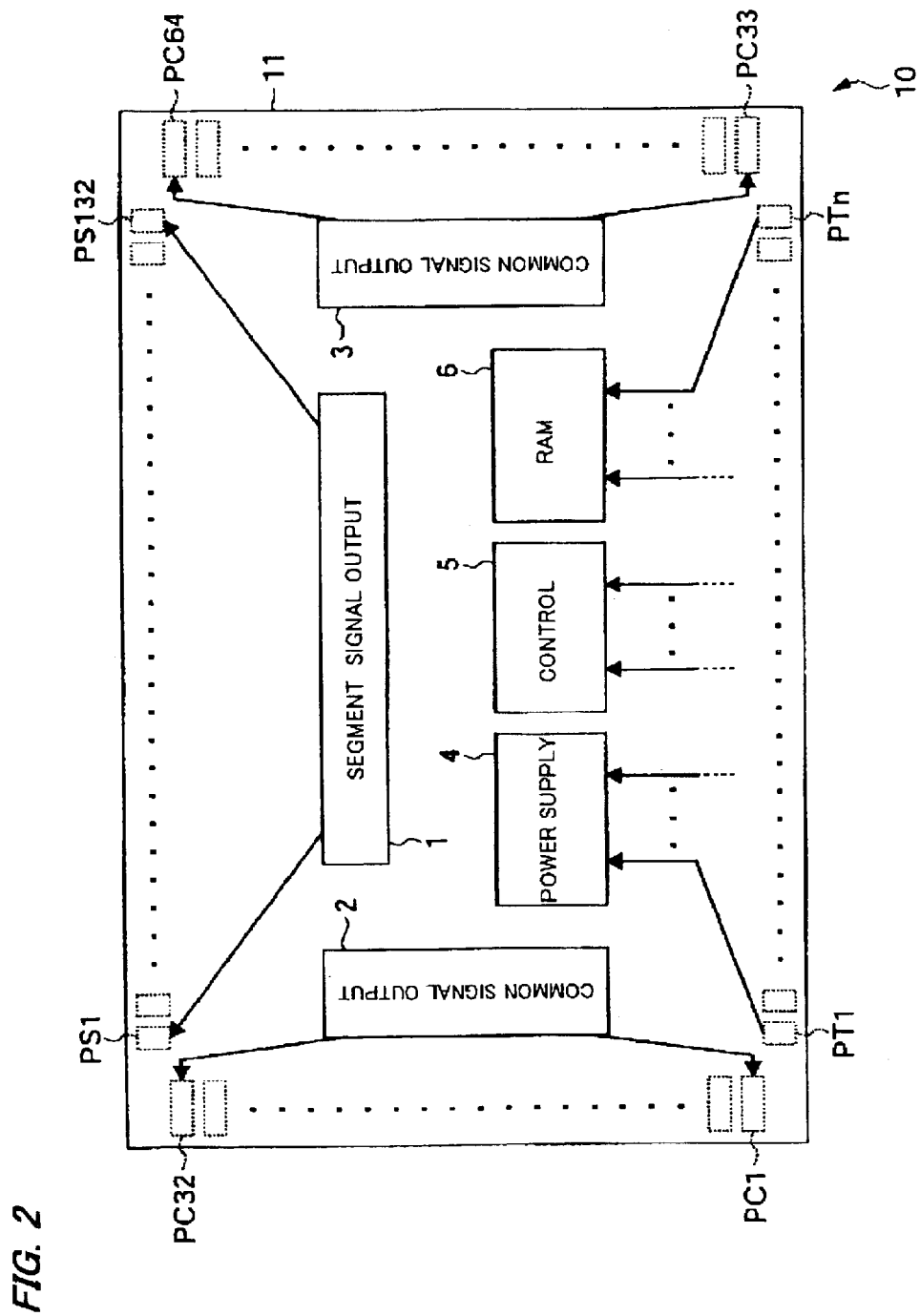
FIG. 2 shows a configuration of a semiconductor device according to an embodiment of the present invention.

The driver IC 10 shown in FIG. 1 is described below in detail with reference to FIG. 2. The driver IC 10 is mounted so that the side of the driver IC 10 on which terminals are formed (active side) faces the substrate 40. FIGS. 1 and 2 show a state viewed from the back side (side opposite to the active side) of the driver IC 10. In FIGS. 1 and 2, the terminals are indicated by a broken line and an internal circuit section of the driver IC 10 is indicated by a solid line for convenience.

As shown in FIG. 2, the driver IC 10 is formed on a silicon substrate 11. A segment signal output section 1 is formed along one side 11a in the longitudinal direction (upper long side in FIG. 2) of the silicon substrate 11. Common signal output sections 2 and 3 are formed along two sides 11b and 11c (left and right short sides in FIG. 2) which intersect the longitudinal direction of the silicon substrate 11 at right angles. A power supply section 4, a control section 5, and a RAM 6 are formed along the other side 11d (lower long side in FIG. 2) in the longitudinal direction of the silicon substrate 11. In FIG. 2, the arrangement of blocks which make up a circuit is schematically illustrated. The actual arrangement of the blocks and the terminals of the circuit is not limited to the arrangement shown in FIG. 2.

The power supply section 4 performs regulation and the like by receiving a power supply potential from predetermined input/output terminals PT, and supplies power to the segment signal output section 1, the common signal output sections 2 and 3, the control section 5, and the RAM 6. The RAM 6 receives image data from predetermined input/output terminals PT, and temporarily stores the image data. The control section 5 receives control signals and the like from predetermined input/output terminals PT, and controls the segment signal output section 1, the common signal output sections 2 and 3, and the RAM 6.

The segment signal output section 1, the common signal output sections 2 and 3, the power supply section 4, the control section 5, and the RAM 6 are connected with one another through interconnects (not shown). The segment signal output section 1 is connected with the segment signal output terminals (first terminals) PS1 to PS132 provided along the long side (first side) 11a of the silicon substrate 11 on the upper side in FIG. 2. The segment signal output section 1 outputs segment signals through the segment signal output terminals PS1 to PS132.

The common signal output section 2 is connected with the common signal output terminals (second terminals) PC1 to PC32 provided along the short side (second side) 11b of the silicon substrate 11 on the left in FIG. 2. The common signal output section 2 outputs common signals from the common signal output terminals PC1 to PC32. Similarly, the common signal output section 3 is connected with the common signal output terminals (third terminals) PC33 to PC64 provided along the short side (third side) 11c of the silicon substrate 11 on the right in FIG. 2. The common signal output section 3 outputs common signals through the common signal output terminals PC33 to PC64.

The power supply section 4, the control section 5, and the RAM 6 are connected with predetermined input/output terminals PT provided along the long side 11d of the silicon substrate 11 on the lower side in FIG. 2. The power supply section 4, the control section 5, and the RAM 6 input a power supply potential or image data or input or output the control signal through the input/output terminals PT.

The terminals are formed by using bumps. There are no specific limitations to the bumps. For example, a gold bump, a solder bump, and the like may be used.

Figure 11:
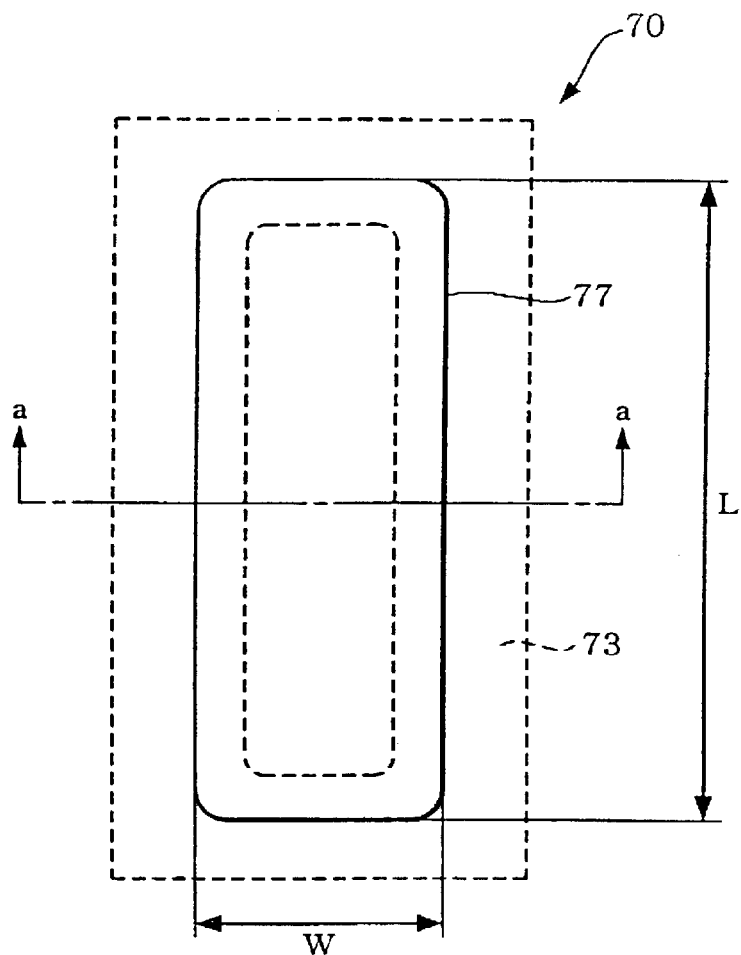
FIG. 11A is a plan view showing an example of a terminal of a semiconductor device according to the present invention.
FIG. 11B is a cross-sectional view along the line a-a shown in FIG. 11A.
Figure 11:
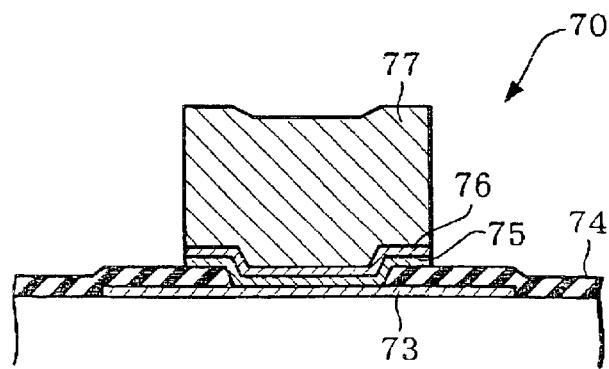

FIGS. 11A and 11B show an example of a gold bump. FIG. 11A is a plan view of a gold bump. FIG. 11B is a cross-sectional view along the line a-a shown in FIG. 11A. A gold bump 70 shown in FIG. 11 is formed on a metal pad 73 formed of aluminum or the like through an opening of a passivation layer 74. The gold bump 70 includes a barrier layer 75 formed of TiW or the like, a first gold layer 76 which is an underlay, and a second gold layer 77 formed by plating or the like. The length L of the gold bump 70 is the length of the second gold layer 77. The width W of the gold bump 70 may be specified by the width of the second gold layer 77.

Figure 12:
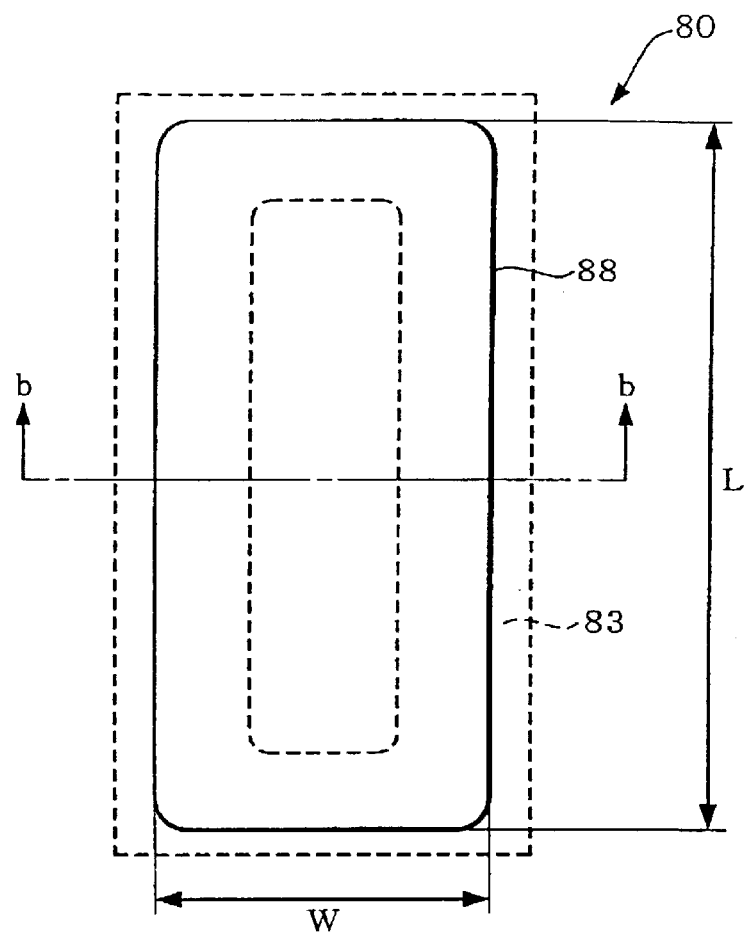
FIG. 12A is a plan view showing another example of a terminal of a semiconductor device according to the present invention.
FIG. 12B is a cross-sectional view along the line b-b shown in FIG. 12A.
Figure 12:
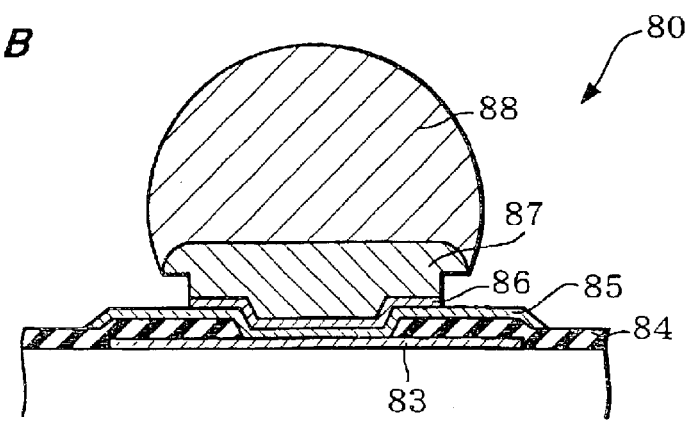

FIGS. 12A and 12B show an example of a solder bump. FIG. 12A is a plan view of a solder bump. FIG. 12B is a cross-sectional view along the line b-b shown in FIG. 12A. A solder bump 80 shown in FIG. 12 is formed on a metal pad 83 formed of aluminum or the like through an opening of a passivation layer 84. The solder bump 80 includes a chromium layer 85, a first copper layer 86 which is an underlay, a second copper layer 87 formed by plating or the like, and a solder layer 88 formed by plating or the like. The length L of the solder bump 80 is the length of the solder layer 88. The width W of the solder bump 80 may be specified by the width of the solder layer 88.

The structure of the output terminal of the semiconductor device according to the present embodiment is not limited to the above bump structure insofar as the output terminal functions as a terminal. Even if the planar shape of the terminal is not accurately rectangular such as in the shape in which the corner is round or oval, the length and the width of the terminal may be specified by the effective lengths in the directions of the long side and the short side.

Generally, the size of the cells of the segment signal output section connected with the segment signal output terminals (hereinafter called "segment driver I/O cells") is the same as the size of the cells of the common signal output section connected with the common signal output terminals (hereinafter called "common driver I/O cells") in the driver IC. These driver I/O cells are generally arranged at the same pitch. This is because a finer process design rule inside the driver IC has enabled the common driver I/O cells and the segment driver I/O cells to be arranged at the same pitch, and the layout inside the IC is more convenient if the common driver I/O cells and the segment driver I/O cells are arranged at the same pitch. The pitch of both the common signal output terminals and the segment signal output terminals tends to be greater than the arrangement pitch of the driver I/O cells. This is because the minimum pitch of the driver I/O cells can be easily decreased by using a finer process rule inside the IC, although it is difficult to decrease the minimum pitch of the terminals since the minimum pitch is generally determined depending on the external connection conditions, external connection pitch, and the like. Therefore, in the case where the pitch of both the common signal output terminals and the segment signal output terminals is greater than the arrangement pitch of the driver I/O cells, the driver I/O cells are connected with the terminals by bending the interconnects between the driver I/O cells and the terminals. Therefore, a connection region necessary for bending the interconnects must be secured between the driver I/O cells and the terminals. This results in an increase in the interconnection region in comparison with the case where the terminal pitch is equal to the arrangement pitch of the driver I/O cells. The connection region is increased as the difference between the pitch of the terminals and the pitch of the driver I/O cells is increased, whereby the area of the entire IC is increased. Therefore, it is preferable that the pitch and the width of the segment signal output terminals and the common signal output terminals be as small as possible provided that the external connection conditions are satisfied. There may be a case where a part of the segment signal output terminals is provided along the short side of the substrate, or a part of the common signal output terminals is provided along the long side of the substrate.

Misalignment occurring when mounting the driver IC on the substrate is described below with reference to FIG. 3. As an alignment method when mounting the driver IC on the substrate, two or more alignment marks are generally formed on each of the driver IC and the substrate, and the mutual position of the driver IC and the substrate is adjusted so that the alignment marks are placed at predetermined positions. The alignment marks are generally formed on both ends of the long side of the driver IC in order to improve alignment accuracy. There may be a case where the driver IC and the substrate are aligned by recognizing the positions of the terminals of the driver IC and the electrode pattern of the substrate as the alignment marks instead of an exclusive pattern for alignment. The alignment at the time of mounting is generally performed according to the following method.

1. The coordinates of the driver IC, chip size information, and the coordinates of the alignment marks of the substrate are input to a mounting device.

2. The driver IC and the substrate are separately secured to the mounting device so that the positions of the driver IC and the substrate can be adjusted.

3. The positions of the two alignment marks of the driver IC are optically recognized.

4. The center of the chip is calculated from the coordinates of the alignment marks of the driver IC and the chip size information.

5. The positions of the two alignment marks of the substrate are optically recognized in the same manner as those of the driver IC.

6. A point on the substrate corresponding to the center of the chip is calculated from the coordinates of the two alignment marks of the substrate and the chip size information.

7. The mutual position of the driver IC and the substrate is adjusted in the X direction and the Y direction so that the center of the driver IC coincides with the corresponding point on the substrate, and the rotational direction is adjusted so that the alignment marks of the driver IC and the substrate are placed at predetermined positions.

However, the following misalignment occurs even if the above-described alignment is performed at the time of mounting. Specifically, as misalignment occurring when mounting the driver IC on the substrate, an assumed error $\Delta X_1$ in the longitudinal direction (X direction) of the driver IC, an assumed error $\Delta Y_1$ in the direction of the short side (Y direction) of the driver IC, and an assumed error $\Delta \theta$ of the angle of the driver IC shown in FIG. 3 can be given. In FIG. 3, a solid line indicates the position of the driver IC in a normal state, and a broken line indicates the position of the driver IC in a state in which the driver IC is misaligned at an angle around the center of the chip.

Let the length of the driver IC in the longitudinal direction be $X_1$. If an assumed error $\Delta Y_2 \approx (X_1/2) \sin \Delta \theta$ in the Y direction caused by the assumed angular error $\Delta \theta$ (hereinafter called "rotational error") occurs, the total assumed error $\Delta Y$ in the Y direction is $\Delta Y_1 + \Delta Y_2$. The assumed errors $\Delta X$ and $\Delta Y$ are described below.

Generally, an electrode pull-out direction of the substrate near the chip intersects at right angles the direction of the side of the chip on which a plurality of terminals are disposed. In more detail, the external electrode pull-out direction from the terminal disposed in the longitudinal direction (X direction) of the driver IC is the Y direction near the chip. The external electrode pull-out direction from the terminal disposed in the direction of the short side (Y direction) of the driver IC is the X direction near the chip. The above electrode pull-out direction is necessary for securing connection with a plurality of terminals and for extracting each electrical signal to the outside so as not to intersect each other. The distance between the adjacent electrodes is not decreased even if the size of each electrode is increased in the electrode pull-out direction to some extent. Therefore, alignment allowance for misalignment of the terminal in the electrode pull-out direction is easily secured by increasing the size of the electrode in advance only for the rotational error of the terminal. In more detail, alignment allowance between the terminal and the external electrode is easily secured for the terminal disposed in the longitudinal direction (X direction) for misalignment in the Y direction, and alignment allowance between the terminal and the external electrode is easily secured for the terminal disposed in the direction of the short side (Y direction) for misalignment in the X direction. On the contrary, it is difficult to secure alignment allowance between the terminal and the external electrode for the terminal disposed in the longitudinal direction (X direction) for misalignment in the X direction, and it is difficult to secure alignment allowance between the terminal and the external electrode for the terminal disposed in the direction of the short side (Y direction) for misalignment in the Y direction.

Figure 3:
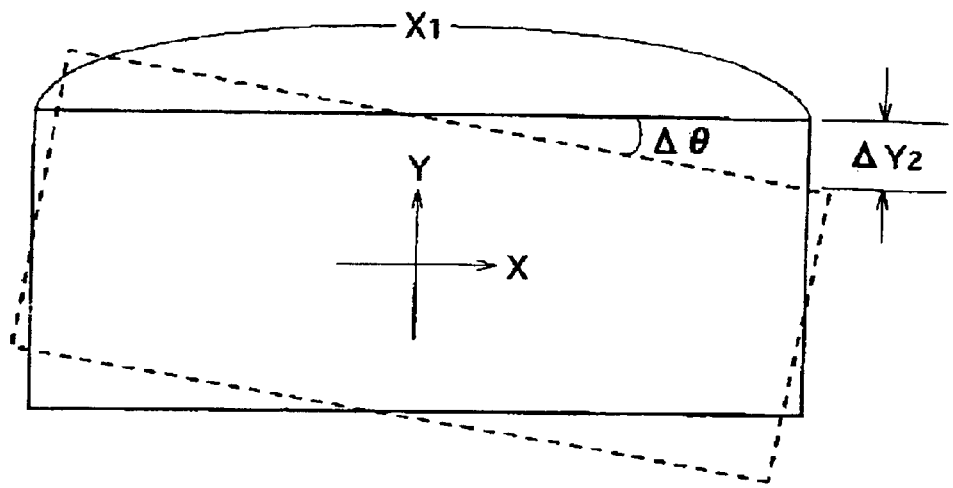
FIG. 3 shows angular misalignment when mounting a semiconductor device on a substrate.

The rotational error in the case where the chip is rotated at an angle $\Delta \theta$ around the center of the chip as shown in FIG. 3 is described below. In the present embodiment, a point at coordinates (x and y) is examined on the assumption that the coordinates of the center of the chip are (0,0).

The rotational error of the terminal disposed in the direction of the short side (Y direction) is examined below. In this case, the rotational error $\Delta y$ in the Y direction is approximately $x \sin \Delta \theta$. In the case where the terminal is disposed almost at the end of the chip, since x is half of the length of the chip (X direction), $\Delta y = (X_1/2) \sin \Delta \theta$. The rotational error $\Delta x$ in the X direction is approximately $y \sin \Delta \theta$. Since y is the y coordinate of the terminal, the rotational error depends on the position at which the terminal is disposed. In the case where the terminal is disposed at the center of the short sides 11b and 11c (see FIG. 2), the rotational error in the X direction is 0 since y=0. In the case where the terminal is disposed near the upper side of the chip, y is approximately $(Y_1/2)$, whereby the rotational error is given by $\Delta X_2 \approx -(Y_1/2) \sin \Delta \theta$. Since the rotational error $\Delta X_2$ in the X direction generally coincides with the electrode pull-out direction of the substrate, alignment allowance of the electrode is easily secured. Therefore, it is unnecessary to take into consideration the rotational error $\Delta X_2$.

The effect of the assumed angular error $\Delta \theta$ on the terminal disposed in the longitudinal direction (X direction) is examined below. The rotational error $\Delta x$ in the X direction is approximately $-y \sin \Delta \theta$. In the case the terminal is disposed almost at the end of the chip, since y is half of the length of the chip (Y direction), $\Delta x = -(Y_1/2) \sin \Delta \theta$. Since $Y_1 < X_1$ in the case of a long and narrow chip such as a driver IC, the amount of misalignment in the longitudinal direction (X direction) is smaller than the rotational error $(X_1/2) \sin \Delta \theta$ in the direction of the short side (Y direction). Therefore, the effect of the assumed angular error $\Delta \theta$ on the terminal disposed in the longitudinal direction is not taken into consideration in the present embodiment.

The rotational error $\Delta y$ in the Y direction is approximately $x \sin \Delta \theta$. Since x is the x coordinate of the terminal, the rotational error depends on the position at which the terminal is disposed. In the case where the terminal is disposed almost at the center in the longitudinal direction, the rotational error is approximately 0 since x=0. In the case where the terminal is disposed near the end of the longitudinal direction, specifically, near the corner close to the terminal disposed in the direction of the short side, the maximum value of x is approximately $(X_1/2)$. In this case, the rotational error is given by $\Delta x \approx (X_1/2) \sin \Delta\theta$ in the same manner as the rotational error of the terminal disposed in the direction of the short side in the Y direction. In other words, the rotational error in the Y direction of the terminal disposed in the longitudinal direction is small in the case where the terminal is disposed almost at the center of the longitudinal direction, and increased as the terminal is closer to the end of the chip, specifically, closer to the terminal disposed in the direction of the short side. However, since the rotational error in the Y direction coincides with the electrode pull-out direction of the substrate in the same manner as the rotational error in the X direction of the terminal disposed in the direction of the short side, alignment allowance of the electrode is easily secured.

Therefore, a rotational error which has the greatest effect as the alignment error caused by the assumed angular error $\Delta\theta$ is the rotational error in the Y direction at a position of the terminal disposed at the end of the chip in the direction of the short side (Y direction), which is expressed by $\Delta Y_2 \approx (X_1/2) \sin \theta$. Since the assumed error $Y_1$ other than the rotational error is also applied to the terminal disposed in the direction of the short side, the total assumed error $\Delta Y$ in the Y direction is approximately $\Delta Y_1 + \Delta Y_2$.

In the present situation, a specific amount of misalignment is 4 $\mu$m both in the X direction and in the Y direction in the case of using a mounting device with high accuracy, and usually about 7 to 8 $\mu$m. The assumed error $\Delta\theta$ is about 0.015° to 0.025°. In the case where $X_1$=8000 $\mu$m, $\Delta X_1$= $\Delta Y_1$=4 $\mu$m, and $\Delta\theta$=0.015°, $\Delta Y \approx 4$ $\mu$m+4 mm. sin (0.015°)≈5 $\mu$m in the case where the assumed errors are the largest.

As is clear from the above equation, since the rotational error is added to the alignment error in the Y direction, the alignment error in the Y direction is larger than the assumed error in the X direction. The above calculation is on the assumption that angular misalignment occurs around the center of the chip. In the case where angular misalignment occurs when aligning the right of the chip by using the upper left of the chip as the center instead of the center of the chip, the assumed error in the Y direction caused by the assumed angular error $\Delta\theta$ is expressed by $\Delta Y_2 \approx X_1 \sin \Delta\theta$, which is twice the assumed error in the case of angular misalignment around the center of the chip.

The relation between the electrode of the substrate and the output terminal of the driver IC is described below.

The electrodes of the substrate are made up of the ends of the segment interconnects LS1 to LS132 and the common interconnects LC1 to LC64 on the substrate 40. The electrode of the substrate has a shape which allows misalignment of the driver IC in the direction of the length of the output terminal. Therefore, if the mounting position of the driver IC is shifted in the direction of the length of the output terminal, the junction area between the output terminal and the electrode of the substrate is not decreased unless the output terminal protrudes from the electrode of the substrate. In this case, the junction area between the output terminal and the electrode of the substrate is determined depending on misalignment of the driver IC in the direction of the width of the output terminal. Therefore, the junction area between the output terminal disposed along the long side of the driver IC and the electrode of the substrate is rarely affected by misalignment in the direction of the short side of the driver IC (misalignment in the direction of the length of the terminal). However, the junction area between the output terminal disposed along the long side of the driver IC and the electrode of the substrate is easily affected by misalignment in the longitudinal direction of the driver IC (misalignment in the direction of the width of the terminal), whereby the junction area is decreased when the amount of misalignment exceeds a certain value. The junction area between the output terminal disposed along the short side of the driver IC and the electrode of the substrate is rarely affected by misalignment in the longitudinal direction of the driver IC (misalignment in the direction of the length of the terminal). However, the junction area between the output terminal disposed along the short side of the driver IC and the electrode of the substrate is easily affected by misalignment in the direction of the short side of the driver IC (misalignment in the direction of the width of the terminal), whereby the junction area is decreased when the amount of misalignment exceeds a certain value.

The effect of the amount of misalignment caused by the assumed angular error of the driver IC (rotational error) on the junction area between the output terminal and the electrode of the substrate is examined below. The output terminal disposed along the long side of the driver IC is less affected by the rotational error caused by the assumed angular error, since the assumed angular error mainly consists of misalignment components in the direction of the length of output terminal. However, the output terminal disposed along the short side of the driver IC is considerably affected by the rotational error caused by the assumed angular error, since the assumed angular error mainly consists of misalignment components in the direction of the width of the output terminal. As a result, a factor which significantly affects the junction area between the output terminal and the electrode of the substrate when mounting the driver IC on the substrate is the amount of misalignment in the longitudinal direction of the driver IC (amount of misalignment in the widthwise direction of the terminal) in the case of the output terminal disposed along the long side of the driver IC, and the amount of misalignment in the direction of the short side of the driver IC (amount of misalignment in the direction of the width of the terminal) and the amount of misalignment caused by the assumed angular error in the case of the output terminal disposed along the short side of the driver IC.

Figure 4A:
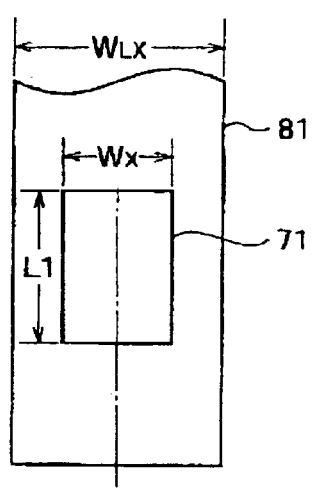
FIGS. 4A and 4B show a state in which the positional relationship between an output terminal of a semiconductor device and an electrode of a substrate is normal.
Figure 4B:
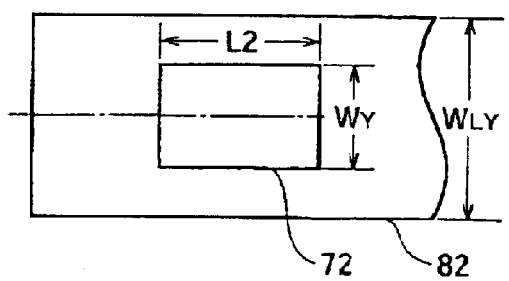
Figure 5A:
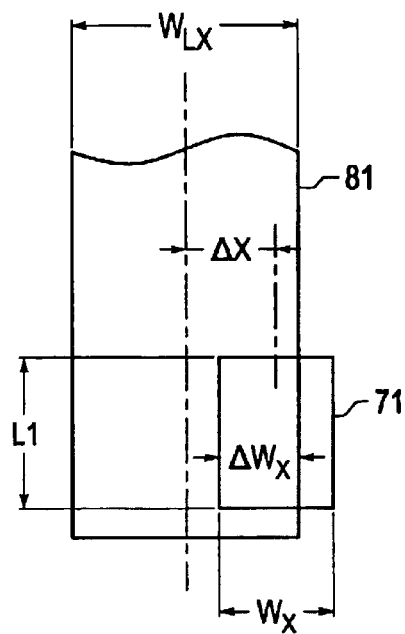
FIGS. 5A and 5B show a state in which misalignment occurs between an output terminal of a semiconductor device and an electrode of a substrate.
Figure 5B:
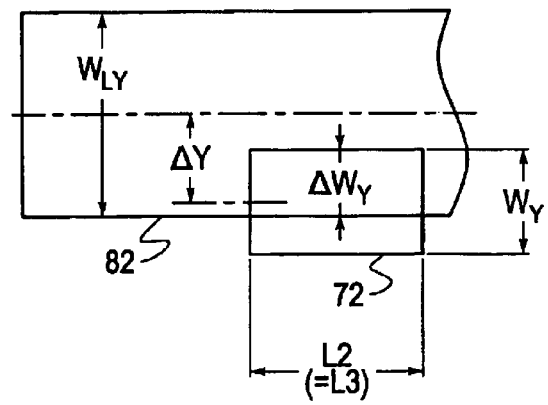

The junction area between the output terminal of the driver IC and the electrode of the substrate is described below with reference to FIGS. 4A, 4B, 5A, and 5B. FIGS. 4A and 4B show a state in which the positional relation between the output terminal of the driver IC and the electrode of the substrate is normal. FIGS. 5A and 5B show a state in which misalignment occurs between the output terminal of the driver IC and the electrode of the substrate.

As shown in FIG. 4A or 5A, let the length and the width of the output terminal (segment signal output terminals PS1 to PS132 in the present embodiment) 71 disposed along the long side of the driver IC be respectively L1 and $W_X$, and the width of a corresponding electrode 81 of the substrate be $W_{LX}$. As shown in FIG. 4B or 5B, let the length and the width of the output terminal (common signal output terminals PC1 to PC64, which are second and third terminals, in the present embodiment) 72 disposed along the short side of the driver IC be respectively L2 (=L3) and $W_Y$, and the width of a corresponding electrode 82 of the substrate be $W_{LY}$. In FIGS. 4 and 5, $W_X < W_{LX}$ and $W_Y < W_{LY}$.

If the total assumed error $\Delta X$ in the X direction of the driver IC with respect to the substrate exceeds $(W_{LX} - W_X)/2$, the output terminal 71 of the driver IC protrudes from the electrode 81 of the substrate as shown in FIG. 5A, whereby the junction area between the output terminal 71 and the electrode 81 is decreased. The width $\Delta W_X$ of the output terminal 71 on the electrode 81 of the substrate is expressed by $\Delta W_X = W_X - (\Delta X + W_X/2 - W_{LX}/2) = (W_X + W_{LX})/2 - \Delta X$.

Similarly, if the total assumed error $\Delta Y$ in the Y direction of the driver IC with respect to the substrate exceeds $(W_{LY} - W_Y)/2$, the common signal output terminal of the driver IC protrudes from the electrode of the substrate as shown in FIG. 5B, whereby the junction area between the common signal output terminal and the electrode is decreased. The width $\Delta W_Y$ of the output terminal on the electrode of the substrate is expressed by $\Delta W_Y = W_Y - (\Delta Y + W_Y/2 - W_{LY}/2) = (W_Y + W_{LY})/2 - \Delta Y$.

Since $\Delta X = \Delta X_1$ and $\Delta Y = \Delta Y_1 + \Delta Y_2 = \Delta Y_1 + (X_1/2) \sin \Delta \theta$, if $\Delta X_1 = \Delta Y_1$, misalignment of the output terminal (common signal output terminal) 72 is greater than misalignment of the output terminal (segment signal output terminal) 71.

As is clear from the above equation, the rotational error $\Delta Y_2$ in the Y direction caused by the assumed angular error $\Delta \theta$ is considerably increased in comparison with the error $\Delta Y_1$ as the length $X_1$ in the longitudinal direction of the driver IC and the assumed angular error $\Delta \theta$ are increased, whereby the rotational error is added to the error in the Y direction. Therefore, in the case where $\Delta X_1$ and $\Delta Y_1$ are approximately the same, the assumed error in the Y direction is greater than the assumed error in the X direction.

In the present invention, the junction area of the common signal output terminal is prevented from being smaller than the junction area of the segment signal output terminal by setting the length L2 of the common signal output terminal to be greater than the length L1 of the segment signal output terminal. The relation between the length L1 of the segment signal output terminal and the length L2 of the common signal output terminal is expressed by $L2 \Delta W_Y \geq L1 \Delta W_X$. Therefore, a relation expressed by the following equation (2) is balanced.

$$L2\{(W_Y + W_{LY})/2 - \Delta Y\} \geq L1\{(W_X + W_{LX})/2 - \Delta X\} \quad (2)$$

$$L2/L1 \geq \{(W_X + W_{LX})/2 - \Delta X\}/\{(W_Y + W_{LY})/2 - \Delta Y\} =$$

$$\{(W_X + W_{LX})/2 - \Delta X_1\}/$$

$$\{(W_Y + W_{LY})/2 - \Delta Y_1 - (X_1/2)\sin\Delta\theta\}$$

$X_1$: Length in the longitudinal direction of the driver IC $W_X$: Width of the output terminal disposed in the longitudinal direction of the driver IC $W_{LX}$: Width of the electrode of the substrate disposed in the longitudinal direction of the driver IC $W_Y$: Width of the output terminal disposed in the direction of the short side of the driver IC $W_{LY}$: Width of the electrode of the substrate disposed in the direction of the short side of the driver IC $\Delta X_1$: Assumed alignment error in the longitudinal direction of the IC (X direction) when mounting the driver IC on the substrate $\Delta Y_1$: Assumed alignment error in the direction of the short side of the IC (Y direction) when mounting the driver IC on the substrate $\Delta \theta$: Assumed alignment angular error when mounting the driver IC on the substrate As is clear from the above equation, the rotational error $\Delta Y_2$ in the Y direction caused by the assumed angular error $\Delta \theta$ is considerably increased in comparison with the error $\Delta Y_1$ as the length $X_1$ in the longitudinal direction of the driver IC and the assumed angular error $\Delta \theta$ are increased, whereby the rotational error is added to the error in the Y direction. Therefore, in the case where $\Delta X_1$ and $\Delta Y_1$ are approximately the same, the assumed error in the Y direction is greater than the assumed error in the X direction.

If the widths $W_{LX}$ and $W_{LY}$ of the electrodes of the substrate are respectively equal to the widths $W_X$ and $W_Y$ of the output terminals of the driver IC in the above equation (2), the following equation (1) is balanced.

$$L2/L1 \geq (W_X - \Delta X1)/\{W_Y - \Delta Y_1 - (X_1/2)\sin \Delta\theta\} \quad (1)$$

Examples in which the above equation (2) is balanced are described below.

As a first example, in the case where the assumed error $\Delta X_1$ in the longitudinal direction (X direction) of the driver IC and the assumed error $\Delta Y_1$ in the direction of the short side (Y direction) are 4 μm, and the assumed angular error $\Delta \theta$ of the driver IC is 0.015°, a condition expressed by $L2/L1 \geq \{(W_X + W_{LX})/2 - 4 \ \mu m\}/\{(W_Y + W_{LY})/2 - 1.3 \times 10^{-4} X_1 - 4 \ \mu m\}$ is obtained.

If the widths $W_{LX}$ and $W_{LY}$ of the electrodes of the substrate are respectively equal to the widths $W_X$ and $W_Y$ of the output terminal of the driver IC, $L2/L1 \geq (W_X - 4 \ \mu m)/(W_Y 31 \ 1.3 \times 10^{-4} X_1 - 4 \ \mu m)$ is obtained. In the case where the length $X_1$ in the longitudinal direction of the driver IC is 8 mm, the width $W_X$ of the segment signal output terminal is 35 μm, and the width $W_Y$ of the common signal output terminal is 35 μm, $L2/L1 \geq -1.035$ is obtained.

As a second example, in the case where the widths $W_{LX}$ and $W_{LY}$ of the electrodes of the substrate differ from the widths $W_X$ and $W_Y$ of the output terminals of the driver IC such as in the case where the width of the electrode of the substrate is 2 μm greater than the width of the driver output terminal (the widths $W_{LX}$ and $W_{LY}$ of the electrodes of the substrate are 37 μm and the widths $W_X$ and $W_Y$ of the output terminals are 35 μm, for example), $W_{LX} = W_X + 2$ μm and $W_{LY} = W_L + 2$ μm. Therefore, $L2/L1$ is given by $L2/L1 \geq \{(W_X + W_{LX})/2 - \Delta X\}/\{(W_Y + W_{LY})/2 - \Delta Y\} = (W_X + 1 \ \mu m - \Delta X_1)/\{W_Y + 1 \ \mu m - \Delta Y_1 - (X_1/2) \sin \Delta \theta\}$.

In the case where the assumed error $\Delta X_1$ in the longitudinal direction (X direction) of the driver IC and the assumed error $\Delta Y_1$ in the direction of the short side (Y direction) are 4 μm, and the assumed angular error $\Delta \theta$ of the driver IC is 0.015° in the same manner as in the first example, $L2/L1 \geq (W_X - 3 \ \mu m)/(W_Y - 1.3 \times 10^{-4} X_1 - 3 \ \mu m)$.

In the case where the length $X_1$ of the driver IC in the longitudinal direction is 8 mm, the width $W_X$ of the segment signal output terminal is 35 μm, and the width $W_Y$ of the common signal output terminal is 35 μm, $L2/L1 \geq 1.034$ is obtained.

As a third example, in the case where the assumed error $\Delta X_1$ in the longitudinal direction (X direction) of the driver IC and the assumed error $\Delta Y_1$ in the direction of the short side (Y direction) are 7 μm, and the assumed angular error $\Delta \theta$ of the driver IC is 0.015°, a condition expressed by $L2/L1 \geq \{(W_X + W_{LX})/2 - 7 \ \mu m\}/\{(W_Y + W_{LY})/2 - 1.3 \times 10^{-4} X_1 - 7 \ \mu m\}$ is obtained.

If the widths $W_{LX}$ and $W_{LY}$ of the electrodes of the substrate are respectively equal to the widths $W_X$ and $W_Y$ of the output terminals of the driver IC, $L2/L1$ is given by $L2/L1 \geq (WX - 7 \ \mu m)/(W_Y - 1.3 \times 10^{-4} X_1 - 7 \ \mu m)$. In the case where the length $X_1$ of the driver IC in the longitudinal direction is 8 mm, the width $W_X$ of the segment signal output terminal is 35 μm, and the width $W_Y$ of the common signal output terminal is 35 μm, $L2/L1 \geq 1.039$ is obtained.

As a fourth example, in the case where the widths $W_{LX}$ and $W_{LY}$ of the electrodes of the substrate differ from the widths $W_X$ and $W_Y$ of the output terminals of the driver IC such as in the case where the width of the electrode of the substrate is 2 μm greater than the width of the driver output terminal (the widths $W_{LX}$ and $W_{LY}$ of the electrodes of the substrate are 37 μm and the widths $W_X$ and $W_Y$ of the output terminals are 35 μm, for example), the assumed error $\Delta X_1$ in the longitudinal direction (X direction) of the driver IC and the assumed error $\Delta Y_1$ in the direction of the short side (Y direction) are 7 μm, and the assumed angular error $\Delta\theta$ of the driver IC is 0.015°, L2/L1 is given by L2/L1$\geq$($W_X$−6 μm)/($W_Y$−1.3×10$^{-4}$$X_1$−6 μm).

In the case where the length $X_1$ in the longitudinal direction of the driver IC is 8 mm, the width $W_X$ of the segment signal output terminal is 35 μm, and the width $W_Y$ of the common signal output terminal is 35 μm, L2/L1$\geq$1.037 is obtained.

As a fifth example, in the case where the assumed error $\Delta X_1$ in the longitudinal direction (X direction) of the driver IC and the assumed error $\Delta Y_1$ in the direction of the short side (Y direction) are 8 μm, and the assumed angular error $\Delta\theta$ of the driver IC is 0.015°, a condition expressed by L2/L1$\geq$\{($W_X$+$W_{LX}$)/2−8 μm\}/\{($W_Y$+$W_{LY}$)/2−1.3×10$^{-4}$$X_1$−8 μm\} is obtained.

If the widths $W_{LX}$ and $W_{LY}$ of the electrodes of the substrate are respectively equal to the widths $W_X$ and $W_Y$ of the output terminals of the driver IC, L2/L1 is given by L2/L1$\geq$($W_X$−8 μm)/($W_Y$−1.3×10$^{-4}$$X_1$−8 μm). In the case where the length $X_1$ of the driver IC in the longitudinal direction is 8 mm, the width $W_X$ of the segment signal output terminal is 35 μm, and the width $W_Y$ of the common signal output terminal is 35 μm, L2/L1$\geq$1.04 is obtained.

As a sixth example, in the case where the widths $W_{LX}$ and $W_{LY}$ of the electrodes of the substrate differ from the widths $W_X$ and $W_Y$ of the output terminals of the driver IC such as in the case where the width of the electrode of the substrate is 2 μm greater than the width of the driver output terminal (the widths $W_{LX}$ and $W_{LY}$ of the electrodes of the substrate are 37 μm and the widths $W_X$ and $W_Y$ of the output terminals are 35 μm, for example), the assumed error $\Delta X_1$ in the longitudinal direction (X direction) of the driver IC and the assumed error $\Delta Y_1$ in the direction of the short side (Y direction) are 8 μm, and the assumed angular error $\Delta\theta$ of the driver IC is 0.015°, L2/L1 is given by L2/L1$\geq$($W_X$−7 μm)/($W_Y$−1.3×10$^{-4}$$X_1$−7 μm).

In the case where the length $X_1$ of the driver IC in the longitudinal direction is 8 mm, the width $W_X$ of the segment signal output terminal is 35 μm, and the width $W_Y$ of the common signal output terminal is 35 μm, L2/L1$\geq$1.039 is obtained.

As is clear from a comparison between the first, third and fifth examples and the second, fourth and sixth examples, the value for L2/L1 becomes slightly smaller when the width of the electrode is slightly larger than the width of the terminal.

Examples of trial calculation of the ratio (L2/L1) are given below. In the case where the chip size $X_1$ is 6 to 26 mm, the terminal pitch is 55 to 30 μm, a practical range of the terminal width is 45 to 16 μm, and the width of the electrode is the same as the terminal width, the ratio (L2/L1) calculated by using an angle error of 0.015° to 0.025° and an alignment error of 4 to 8 μm as the assumed errors is as follows.

When $X_1$ is 6 to 10 mm, L2/L1 is 1.02 to 1.38,
when $X_1$ is 10 to 14 mm, L2/L1 is 1.03 to 1.62,
when $X_1$ is 14 to 18 mm, L2/L1 is 1.05 to 1.97,
when $X_1$ is 18 to 22 mm, L2/L1 is 1.06 to 2.50,
when $X_1$ is 22 to 26 mm, L2/L1 is 1.07 to 3.44, and
when $X_1$ is 26 mm or more, L2/L1 is 1.09 or more.

As described above, the ratio of the length L1 to the length L2 (L2/L1) can be 1.02 to 3.44 in practice taking into consideration the alignment errors $\Delta X_1$, $\Delta Y_1$, and $\Delta\theta$ when mounting the driver IC on the substrate in the above equations (1) and (2).

In the present embodiment, the junction area of the common signal output terminal (terminal disposed in the direction of the short side of the driver IC) is prevented from being smaller than the junction area of the segment signal output terminal (terminal disposed in the longitudinal direction of the driver IC), even if misalignment is taken into consideration, by setting the length of the common signal output terminal (terminal disposed in the direction of the short side of the driver IC) to be greater than the length of the segment signal output terminal (terminal disposed in the longitudinal direction of the driver IC).

Figure 6:
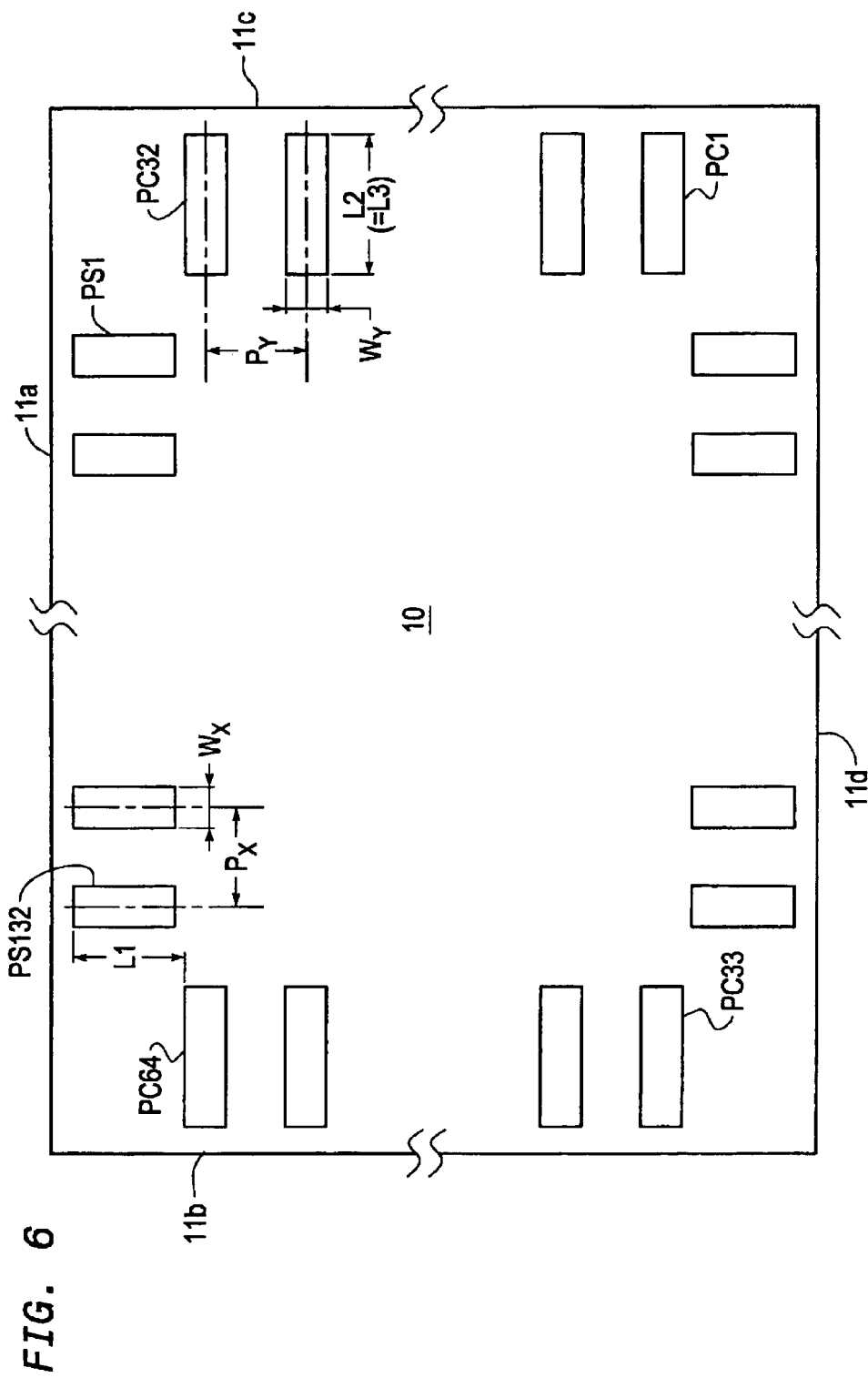
FIG. 6 shows a semiconductor device according to an embodiment of the present invention.
Figure 7:
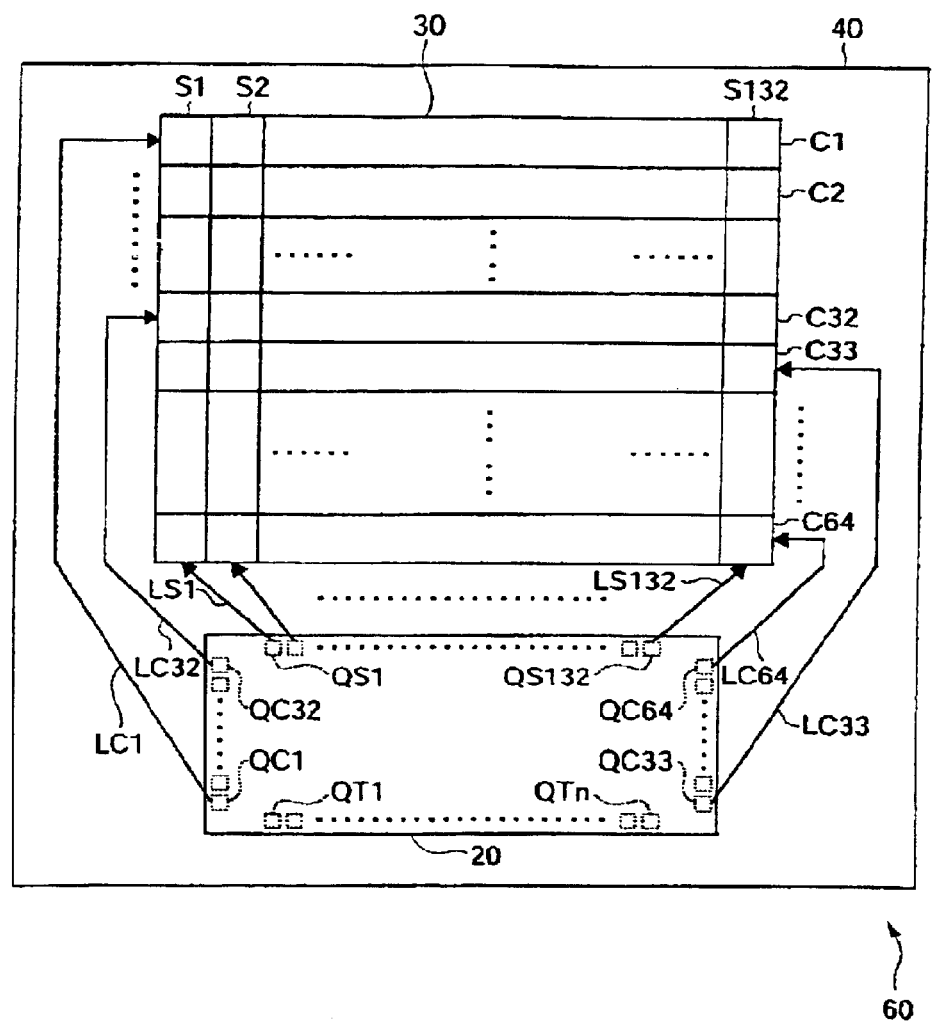
FIG. 7 shows a liquid crystal display device using a conventional semiconductor device.

FIG. 6 shows an arrangement example of the terminals of the driver IC 10 according to the present embodiment. As shown in FIG. 6, the length L2 (=L3) of the common signal output terminals PC1 to PC64 is greater than the length L1 of the segment signal output terminals PS1 to PS132. The pitch $P_X$ of the segment signal output terminals is the same as the pitch $P_Y$ of the common signal output terminals. The width $W_X$ of the segment signal output terminals is the same as the width $W_Y$ of the common signal output terminals.

Figure 13:
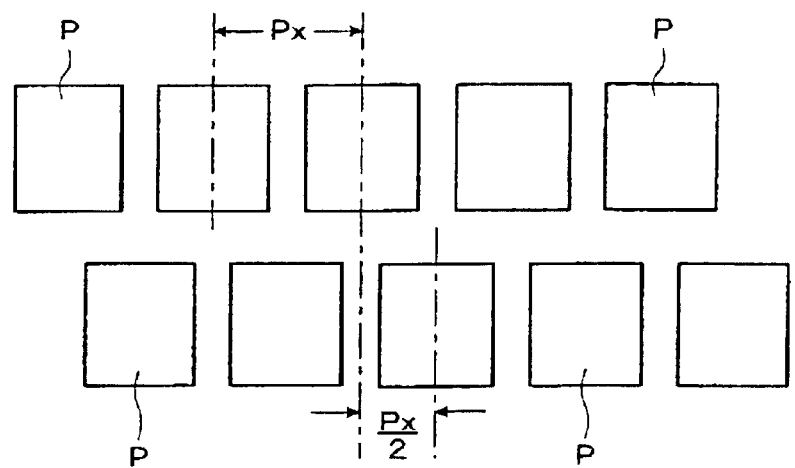
FIG. 13 shows another arrangement example of terminals of a semiconductor device according to the present invention.

The arrangement of the terminals of the driver IC according to the present invention is not limited to that in the above embodiment. The arrangement of the terminals may have other features. As shown in FIG. 13, terminals P may be arranged in a plurality of rows on one side of the driver IC, for example. In the example shown in FIG. 13, the terminals P are arranged in two rows on one side of the driver IC. The terminals P in the second row are shifted at a half-pitch (Px/2) with respect to the terminals P in the first row.

Figure 9:
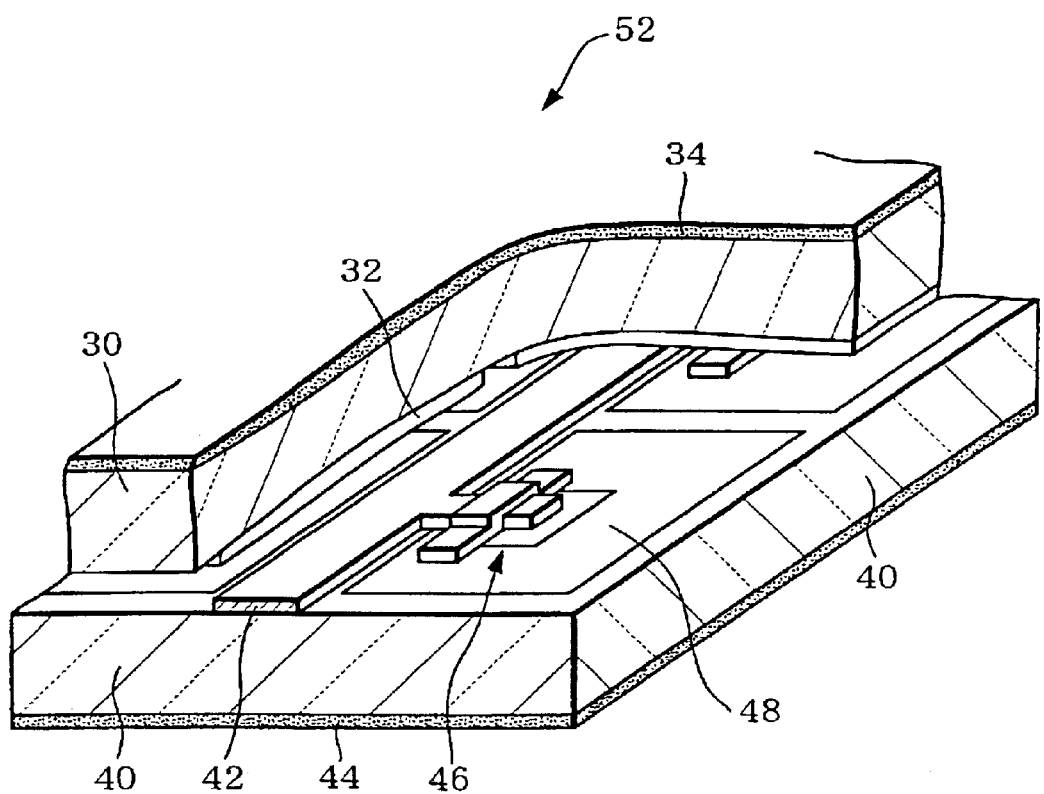
FIG. 9 is a perspective view showing another example of a liquid crystal display device using a semiconductor device according to an embodiment of the present invention.
Figure 10:
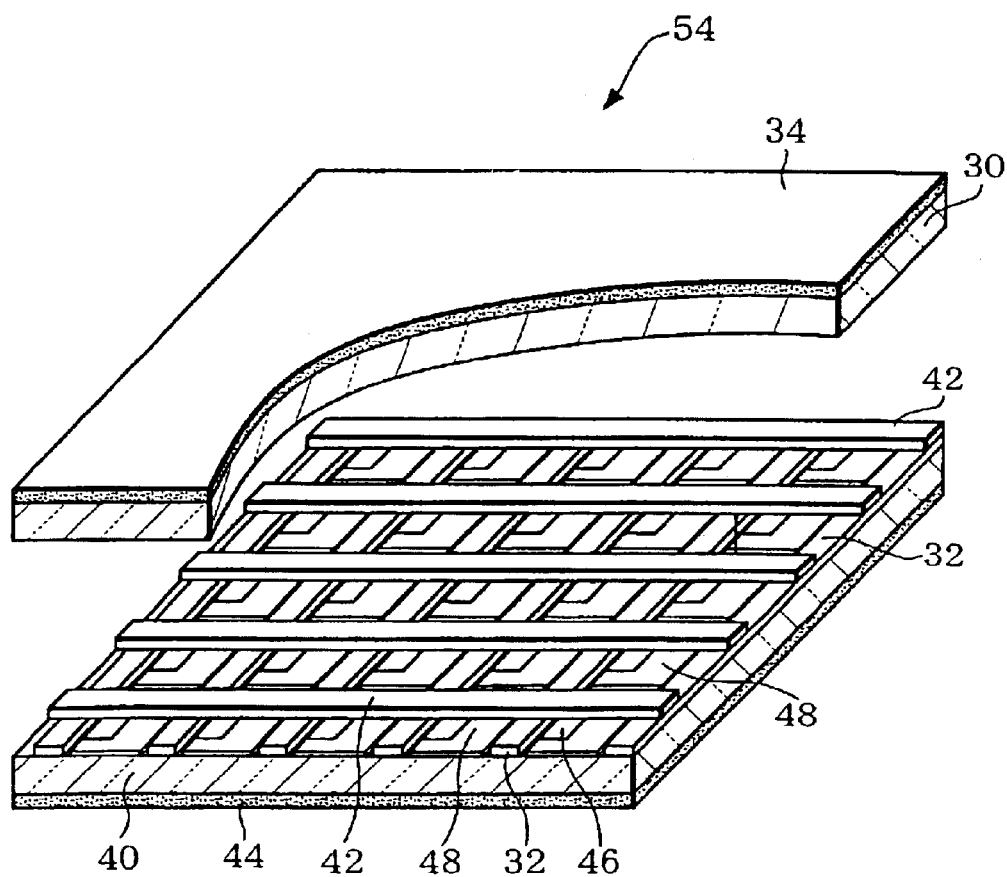
FIG. 10 is a perspective view showing still another example of a liquid crystal display device using a semiconductor device according to an embodiment of the present invention.

The present invention may be applied not only to the liquid crystal display device using the passive matrix drive method according to the above embodiment, but also to electro-optical devices shown in FIGS. 9 and 10 using other drive methods such as an active drive method, for example. In a liquid crystal display device described below, configurations other than the mounting method of the driver IC and the display section such as the segment interconnects and common interconnects are the same as in the above embodiment. In FIGS. 9 and 10, sections the same as those shown in FIGS. 1 and 8 are indicated by the same symbols.

FIG. 9 is a perspective view schematically showing a liquid crystal display device using a two terminal type nonlinear element as an example of an electro-optical device. In this liquid crystal display device 52, two substrates consisting of the first substrate 40 and the second substrate (upper panel) 30 are provided so as to face each other. An electro-optical material (liquid crystal) is sealed between the substrates 40 and 30. A plurality of scanning lines 42 are formed on the first substrate 40. A plurality of data lines 32 in the shape of strips are formed on the second substrate 30 so as to intersect the scanning lines 42. A pixel electrode 48 is connected with the scanning line 42 through a two terminal type nonlinear element 46. In the liquid crystal display device 52, display operations are controlled by switching the electro-optical material into a display state, a non-display state, or an intermediate state between the display state and the non-display state, based on signals applied to the scanning line 42 and the data line 32.

FIG. 10 is a perspective view schematically showing a liquid crystal display device using a TFT (thin film transistor) as an example of an electro-optical device. In this liquid crystal display device 54, two substrates consisting of the first substrate 40 and the second substrate (upper panel) 30 are provided so as to face each other. An electro-optical material (liquid crystal) is sealed between the substrates 40 and 30. A plurality of data lines (source lines) 32 and a plurality of scanning lines (gate lines) 42 which intersect the data lines 32 are provided on the first substrate 40. The pixel electrode 48 is connected with the scanning line 42 through a TFT 46. In the liquid crystal display device 54, display operations are controlled by switching the electro-optical material into a display state, a non-display state, or an intermediate state between the display state and the non-display state, based on signals applied to the scanning line 42 and the data line 32.

In the active drive method, there may be a case where signals output from a semiconductor device are not directly used as drive signals applied to two signal lines which intersect each other at right angles in the pixel region of the electro-optical device, differing from the passive drive method. In the case of using a liquid crystal display device using a TFT as an electro-optical device, a circuit can be formed on the substrate of the liquid crystal display device. Therefore, there may be a case where outputs from an external semiconductor device are allowed to pass through a signal voltage conversion circuit (level interface) or various control circuits on the substrate of the liquid crystal display device, and used as drive signals in the pixel region. For example, in order to decrease the number of output terminals connected with the semiconductor device, there may be a case where a plurality of signals for driving are synthesized by using a multiplexer circuit by means of time division in the semiconductor device, and used as the drive signals in the pixel region after passing through a decoder circuit in the liquid crystal display device. In the liquid crystal display device using a TFT, a shift register circuit may be provided as an internal circuit, and each bit output of the shift register may be applied to each scanning line 42. In this case, it suffices that the output signals from the semiconductor device be only a clock signal and a data start signal. This enables the number of outputs for each scanning line 42 from the semiconductor device to be decreased, whereby the greater part of outputs of three sides of the semiconductor device consisting of one long side and two short sides can be used as signal outputs for another source line 32. Since the present invention relates to the relation between the terminal of the IC and the electrode of the substrate, the present invention can be applied even in the case where each output from the terminals on the long sides and the short sides of the semiconductor device is not directly used as drive signals applied to the signal lines which intersect each other at right angles in the pixel region of the electro-optical device.

Since the present invention relates to the relation between the terminal of the IC and the electrode of the substrate, the present invention can be applied not only to the case of using the mounting method using the combination of the driver IC and the substrate (so-called COG method), but also to the case of using other mounting methods such as a tape module (TAB, COF, and the like) insofar as the relation between the terminal of the IC and the electrode of the substrate is satisfied in the same manner as in the above embodiment. The semiconductor device according to the present invention is not limited to an IC used for a liquid crystal display device. The present invention may be applied to an electro-optical device other than the liquid crystal display device such as an electro-optical device using an EL (electroluminescent) material insofar as the relation between the terminal of the IC and the electrode of the substrate is satisfied in the same manner as in the above embodiment. The semiconductor device according to the present invention is not limited to a driver IC. The present invention may be applied to other ICs having the same shape and the same terminal arrangement as those described in the above embodiment.

What is claimed is:

1. A semiconductor device for supplying a signal to an electro-optical device which displays a two-dimensional image, the semiconductor device comprising:

first terminals which are formed along a first side of the semiconductor device in a longitudinal direction and have a length L1 in a direction intersecting the longitudinal direction at right angles; and second terminals which are formed along a second side intersecting the first side at right angles and have a length L2 which is greater than the length L1 in the longitudinal direction.

2. The semiconductor device as defined in claim 1, wherein a width of each of the first terminals is equal to a width of each of the second terminals.

3. The semiconductor device as defined in claim 1, wherein a pitch of the first terminals is equal to a pitch of the second terminals.

4. The semiconductor device as defined in claim 1, wherein the first terminals and the second terminals are formed by bumps.

5. The semiconductor device as defined in claim 1, further comprising third terminals which are formed along a third side intersecting the first side at right angles and have a length L3 which is greater than the length L1 in the longitudinal direction.

6. The semiconductor device as defined in claim 5, wherein the length L3 of the third terminals is equal to the length L2 of the second terminals.

7. The semiconductor device as defined in claim 1, wherein the first terminals include output terminals for supplying a signal to first electrodes of the electro-optical device, and wherein the second terminals include output terminals for supplying a signal to second electrodes which intersect the first electrodes.

8. The semiconductor device as defined in claim 1, wherein, when a length of the semiconductor device in the longitudinal direction is $X_1$, a width of each of the first terminals is $W_X$, and a width of each of the second terminals is $W_Y$, a width of each of electrodes on a substrate on which the semiconductor device is mounted and which is disposed in the longitudinal direction of the semiconductor device is $W_{LX}$, a width of each of electrodes on the substrate disposed in the direction intersecting the longitudinal direction of the semiconductor device at right angles is $W_{LY}$, $W_{LX}=W_X$, and $W_{LY}=W_Y$, the semiconductor device satisfies the following equation (1):

$$L2/L1 \geq (W_X - \Delta X1)/\{W_Y - \Delta Y_1 - (X_1/2)\sin \Delta\theta\} \tag{1}$$

wherein $\Delta X_1$ is an assumed alignment error of the semiconductor device in the longitudinal direction when mounting the semiconductor device on the substrate, and $\Delta X_1 = \Delta Y_1$ (where $\Delta Y_1$ is an assumed alignment error of the semiconductor device in the direction intersecting the longitudinal direction at right angles when mounting the semiconductor device on the substrate) is satisfied, and wherein Δθ is an assumed angular alignment error of the semiconductor device when mounting the semiconductor device on the substrate.

9. The semiconductor device as defined in claim 8, wherein $\Delta X_1$ is 4 to 8 μm, and Δθ is 0.015° to 0.025°.

10. The semiconductor device as defined in claim 1, wherein ratio of the length L1 to the length L2 (L2/L1) is 1.02 to 3.44.

11. An electro-optical device having an electro-optical material layer, the electro-optical device comprising:

the semiconductor device as defined in claim 1 provided over a substrate, wherein the first terminals include output terminals for supplying a signal to first electrodes, and wherein the second terminals include output terminals for supplying a signal to second electrodes which intersect the first electrodes.

12. The electro-optical device as defined in claim 11, wherein the substrate is the same as a substrate on which the electro-optical material layer is formed.

13. The electro-optical device as defined in claim 11, wherein the substrate differs from a substrate on which the electro-optical material layer is formed.

14. The electro-optical device as defined in claim 11, wherein, when a length of the semiconductor device in the longitudinal direction is $X_1$, a width of each of the first terminals is $W_X$, a width of each of the second terminals is $W_Y$, a width of each of electrodes on the substrate disposed in the longitudinal direction of the semiconductor device is $W_{LX}$, and a width of each of electrodes on the substrate disposed in the direction intersecting the longitudinal direction of the semiconductor device at right angles is $W_{LY}$, the electro-optical device satisfies the following equation (2):

$$L2/L1 \geq \{(W_X + W_{LX})/2 - \Delta X_1\}/\{(W_Y + W_{LY})/2 - \Delta Y_1 - (X_1/2)\sin\Delta\theta\} \quad (2)$$

wherein $\Delta X_1$ is an assumed alignment error of the semiconductor device in the longitudinal direction when mounting the semiconductor device on the substrate, wherein ΔY1 is an assumed alignment error of the semiconductor device in the direction intersecting the longitudinal direction at right angles when mounting the semiconductor device on the substrate, and wherein Δθ is an assumed angular alignment error of the semiconductor device when mounting the semiconductor device on the substrate.

15. The electro-optical device as defined in claim 14, wherein $\Delta X_1$ is 4 to 8 μm, $\Delta Y_1$ is 4 to 8 μm, and Δθ is 0.015° to 0.025°.

16. The electro-optical device as defined in claim 11, wherein the ratio of the length L1 to the length L2 (L2/L1) is 1.02 to 3.44.

17. The electro-optical device as defined in claim 11, wherein the first electrodes are ones of data lines and scanning lines, and the second electrodes are the other of the data lines and the scanning lines.

18. The electro-optical device as defined in claim 11, wherein the electro-optical material is a liquid crystal material, and the liquid crystal material layer is sealed between two substrates which face each other.

* * * * *